United States Patent
Amon et al.

[11] Patent Number: 6,138,204
[45] Date of Patent: Oct. 24, 2000

[54] MULTI BUS ACCESS MEMORY

[75] Inventors: Yossi Amon, Tel Aviv, Israel; Moshe Tarrab, Austin, Tex.; Eytan Engel, Rosh-Haain, Israel

[73] Assignee: Motorola, Inc., Schaumburg, Ill.

[21] Appl. No.: 08/992,466

[22] Filed: Dec. 17, 1997

[51] Int. Cl.[7] .................................................. G06F 13/16
[52] U.S. Cl. .......................... 711/104; 711/105; 711/131; 711/171; 711/172
[58] Field of Search .................................... 711/104, 105, 711/131, 171, 172

[56] References Cited

U.S. PATENT DOCUMENTS

| | | | |
|---|---|---|---|
| 4,633,437 | 12/1986 | Mothersole et al. | 710/74 |
| 4,683,534 | 7/1987 | Tietjen et al. | 710/127 |
| 4,751,671 | 6/1988 | Babetski et al. | 710/56 |
| 5,426,424 | 6/1995 | Vanden Heuvel et al. | 365/189.05 |
| 5,481,496 | 1/1996 | Kobayashi et al. | 340/825.44 |
| 5,579,484 | 11/1996 | Cooper | 711/104 |
| 5,893,927 | 4/1999 | Hovis | 711/105 |

OTHER PUBLICATIONS

English Abstract of German Patent No. dd 284323.

*Primary Examiner*—Reginald G. Bragdon

[57] ABSTRACT

The present invention relates to memory and methods for storing/retrieving data in/from the memory that is accessed by at least two distinct data uses of different actual word widths. A memory for storing addressable binary data comprises a data storage organized in rows and columns of bit array cells, row address decoder and driver for addressing a selected row of bit array cells, column drivers for driving selected columns of bit array cells, and a bus switch port for selectively transferring data between the data storage and a first data bus with a first bus word width p and a second data bus with a second bus word width q smaller than the first bus word width p.

4 Claims, 7 Drawing Sheets

MULTI BUS ACCESS MEMORY

FIELD OF THE INVENTION

The present invention relates to memories, conveniently to random access memory (RAM) and methods for storing/retrieving data in/from the memory that is accessed by multiple data buses of different width.

BACKGROUND OF THE INVENTION

In the electronic arts it is often desired to perform access to a RAM by at least two data buses of different width in respective modes of operation due to respective applications. Typically, but not necessary, in each mode of operation/application the whole RAM is accessed by only one data bus with a specific bus width. That is, this bus transmits data in units of words of a width equal to its bus width. The RAM itself is organized in words of the storage word width which is equal to the largest bus word width or a multiple thereof. Then the basic data unit in the memory is the largest bus word width. Smaller data units, i.e. from buses of smaller word width, are stored as basic data units where not all data bits are used. In the case that the storage word width is a multiple of the largest bus word width, additionally, multiplexing provides storing multiple of the largest bus word width words within one storage word.

Storing of smaller data words from buses of smaller word width results in incomplete use of the memory space. In an extreme case of one bit words stored in a memory configured in eight bit words, this can leave seven eighths of the memory space unused.

FIG. 1 illustrates a prior art DRAM comprising data storage 10 for storing digital information in bit array cells, row address decoder and driver 12 for addressing a selected row of bit array cells, and sense cells and column drivers 14 for sensing the charge status of bit array cells and driving selected columns of bit array cells. The data transfer to and from data storage 10 is illustrated vertically in the right hand side of FIG. 1 and further drawings. The control signal transfer is illustrated mainly horizontally in the left hand side of the drawings. Data storage 10 is organized by way of example in sixteen rows and sixteen columns of bit array cells, thus storing words of a storage word width of sixteen. Data storage 10 is connected with sense cells and column drivers 14 by internal connections 16 having a width equal to the storage word width of sixteen and also equal to the number of sense cells. Sense cells and column drivers 14 serve as a port for exchanging data with data bus 18 having a width equal to the number of sense cells, e.g. sixteen. Lines for sixteen parallel bits are numbered zero to fifteen [15:0].

Electrical connection of the sense cells and column drivers 14 with data storage 10 or data bus 18 is controlled by write signal wr1 and read signal rd1 on signal lines 20. The four-bit address [3:0] within data storage 10 is submitted together with enable signal en to row address decoder and driver 12 via address bus 22. Upon a valid enable signal, row address decoder and driver 12 selects the addressed one of the sixteen rows of bit array cells by enabling the respective one of row enable lines 24.

FIG. 2 illustrates another prior art DRAM with two extensions compared to that of FIG. 1, whereby similar parts have like but primed reference numbers. The first extension is that data storage 10' is organized by way of example in sixteen rows but thirty-two columns of bit array cells, thus storing words of a storage word width of thirty-two. Thus, two words of width sixteen bits are stored within one thirty-two bit word storage by multiplexing (muxing) by column multiplexer 26 between sixteen bits wide sense cells and column drivers 28 and thirty-two columns of bit array cells of data storage 10'. Only 16 bits of the 32-bit word, are accessed on a read/write operation. All even bits, compose the even address word (addr[0] is driven with '0'), and all the odd bits compose the odd address word (addr[0] is driven with '1'). The address space of data storage 10' is increased by a factor of two as is the data storage 10' itself by the doubled word width. Therefore, another address bit is now provided to a total of five address bits, four of which [4:1] are fed to row address decoder and driver 12' as before and address bit [0] is fed to column decoder 30 via address line 32. Column decoder 30 controls column multiplexer 26 according to the value of address bit [0] via multiplexer lines 34. The main reason for multiplexing is to gain faster address decoding timing (two parallel paths of decoding), in addition to a more efficient layout implementation of the sense cells, that can occupy width of two bit slices of the RAM. By muxing, a much simpler circuit is provided between row address decoder and driver 12' and data storage 10' at the expense of a slightly more complicated circuitry between sense cells and column drivers 28 and data storage 10'.

The second extension is that DMA bus 36 (also of width sixteen) is connected to sense cells and column drivers 28. Sense cells and column drivers 28 is now of multi-port type for serving both busses. Bus selection and access to the selected bus is controlled by write signal wr1 and read signal rd1 on signal lines 20' for data bus 18' and by write signal wr2 and read signal rd2 on signal lines 38 for DMA bus 36.

The advantage of this RAM is that the entire storage space of data storage 10' can be used when storing data of a basic word width smaller than the storage word width.

Nowadays, products using RAM can have different modes of operation, whereby data of different word width has to be stored in the RAM. Data of different word width is exchanged with different data busses. According to the state of the art, the storage word width is chosen to correspond to the basic word width, i.e. equal to or a multiple of the basic word width, defined as the largest bus word width. Smaller bus word widths data are stored within one basic word, leaving bits unused.

Accordingly, there is a need to have a RAM that allows the storage of data having a word width smaller than the basic word width of the storage. This need is met by the devices and methods with the features of the independent claims. Additional features of the dependent claims provide further advantages.

DETAILED DESCRIPTION OF THE PREFERRED EMBODIMENT

Figure 1:
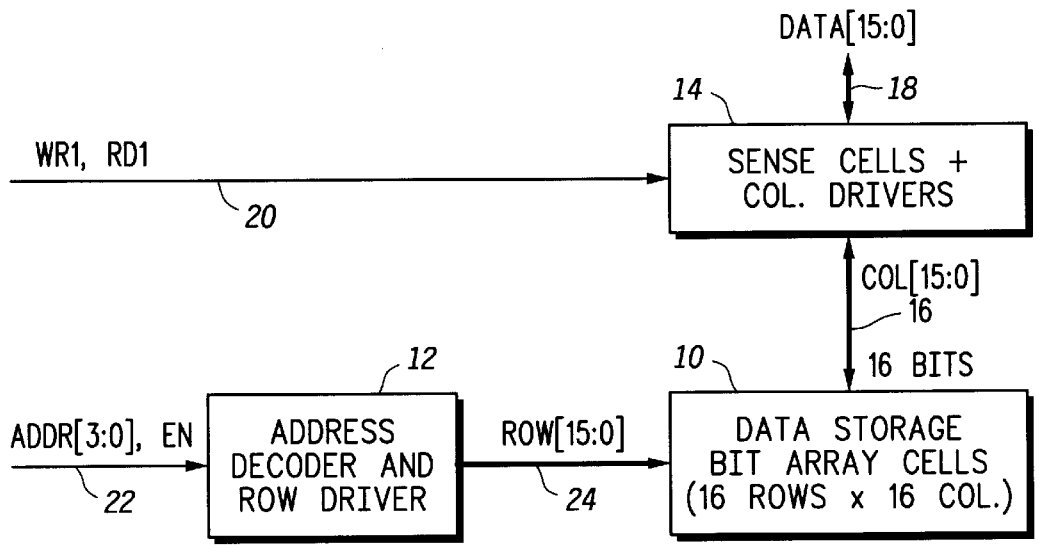
FIG. 1 is a simplified schematic diagram of a simple DRAM according to the prior art.
Figure 2:
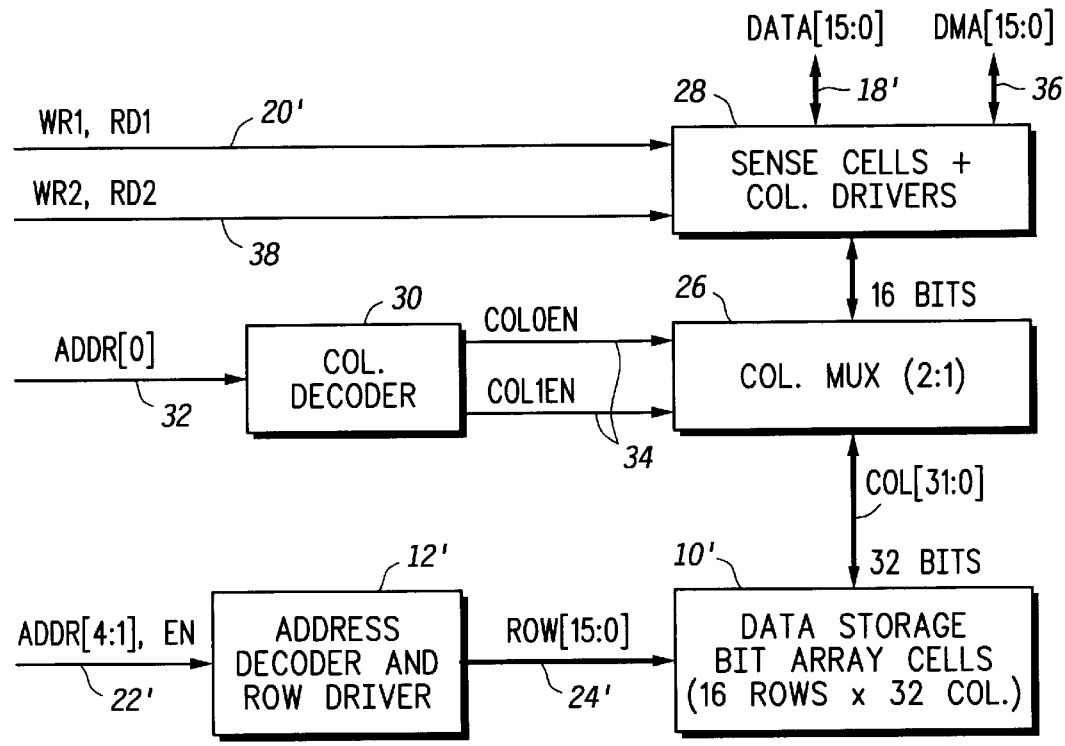
FIG. 2 is a simplified schematic diagram of another DRAM according to the prior art.
Figure 3:
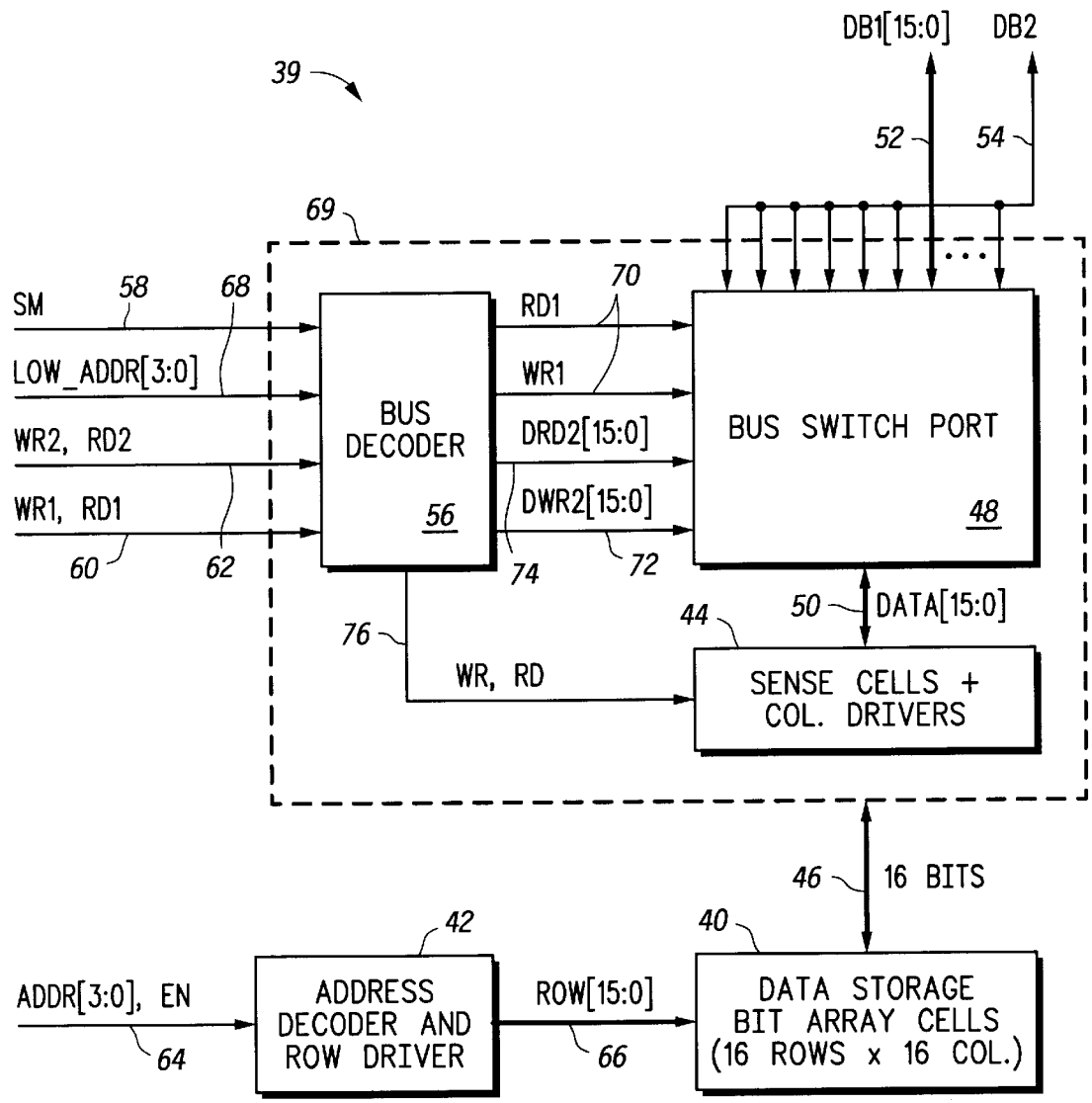
FIG. 3 is a simplified schematic diagram of a DRAM according to the present invention.

FIG. 3 shows a DRAM 39 according to the invention comprising data storage 40, organized in rows and columns of bit array cells (not shown), for storing digital information in bit array cells, row address decoder and driver 42 for addressing a selected row of bit array cells, and sense cells and column drivers 44 for sensing the charge status of bit array cells and driving selected columns of bit array cells. Sense cells and column drivers 44 form a column drivers means. The data transfer to and from data storage 40 is again illustrated vertically in the right hand side of FIG. 3 and further drawings. The control signal transfer is still illustrated mainly horizontally in the left hand side of the drawings. Data storage 40 is organized by way of example in sixteen rows and sixteen columns of bit array cells, thus storing words of a storage word width of sixteen. Data storage 40 is connected with sense cells and column drivers 44 by internal connections 46, preferably, having a width equal to the storage word width of sixteen and, preferably, also equal to the number of sense cells. Sense cells and column drivers 44 are connected with bus switch port 48 by internal data connections 50 of width sixteen. The lines for sixteen parallel bits are numbered zero to fifteen data[15:0]. Bus switch port 48 provides an exchange of data with first data bus 52 having a width by way of this example equal to the number of sense cells of sixteen. Bus lines for sixteen parallel bits are numbered zero to fifteen db1[15:0]. Bus switch port 48 provides also exchanging data with second data bus 54 of widths one with a single bit line db2. On the control side there is bus decoder 56 for selectively connecting sense cells and column drivers 44 to first data bus 52 or second data bus 54 via bus switch port 48.

Select mode signal sm on input control line 58 determines the mode of operation of the RAM, namely whether sixteen-bit words are stored in the RAM and are exchanged with first data bus 52 or, for example, one-bit words are stored in the RAM and are exchanged with second data bus 54. Electrical connection of the sense cells and column drivers 44 with data storage 40 and data buses 52, 54 via bus switch port 48 is controlled by write signal wr1 and read signal rd1 on signal lines 60 for first data bus 52, and by write signal wr2 and read signal rd2 on signal lines 62 for second data bus 54, with respect to select mode signal sm.

Bus decoder 56, bus switch port 48, sense cells and column drivers 44 and the connections between these form means for selectively transferring data 69 between data storage 40 and first data bus 52 with a first bus word width p=16 and second data bus 54 with a second bus word width q=1 smaller than the first bus word width p=16. Means for selectively transferring data 69 comprises a bus select and adaption decoder, namely bus decoder 56, for providing electrical signals for selecting a data bus and selecting columns of bit array cells according to the width of the selected data bus. These control signals are passed to bus switch port 48. The means for selectively transferring data further comprise internal data connections 50 as a hardware bus connection of basic word width m=16 between the data storage and the bus switch port.

In sixteen-bit mode the data storage address space is conveniently four bits wide. The four-bit address [3:0] within data storage 40 is submitted together with enable signal en to row address decoder and driver 42 via address bus 64. Upon a valid enable signal, row address decoder and driver 42 selects the addressed one of the sixteen rows of bit array cells by enabling the respective one of row enable lines 66. In this mode, write signal wr1 and read signal rd1 apply and are, one at a time, submitted from bus decoder 56 to bus switch port 48 via signal lines 70.

In one-bit mode the data storage address space is eight bit wide, comprising conveniently four-bit word address addr [3:0] and an additional four-bit within-a-word address low_addr[3:0] that is fed to bus decoder 56 via input address lines 68. Four-bit word address addr[3:0] is conveniently the same as in sixteen-bit mode and addresses basic storage words. Four-bit within-a-word address low_addr[3:0] is decoded by bus decoder 56 together with now applying write signal wr2 and read signal rd2, one at a time. The result is a decoded write/read signal dwr2/drd2 on one single bit line of sixteen bit wide write control lines 72/read control lines 74, respectively. So, only the selected column is driven. The other columns are not driven but preserve the cell contents, i.e. the stored information. In both modes, decoded write/read signals wr, rd that are bus independent and mode independent are submitted from bus decoder 56 to sense cells and column drivers 44 via signal lines 76.

In this example, write/read signal pairs wr1, rd1 and wr2, rd2 for each bus are fed to bus decoder 56 on signal line pairs and the signals themselves contain the synchronization of the write/read operations. Those skilled in the art know that a single write/read line plus a synchronization impulse line may provide the same total information. They also know that this invention applies also to other RAM without sense cells.

Figure 4:
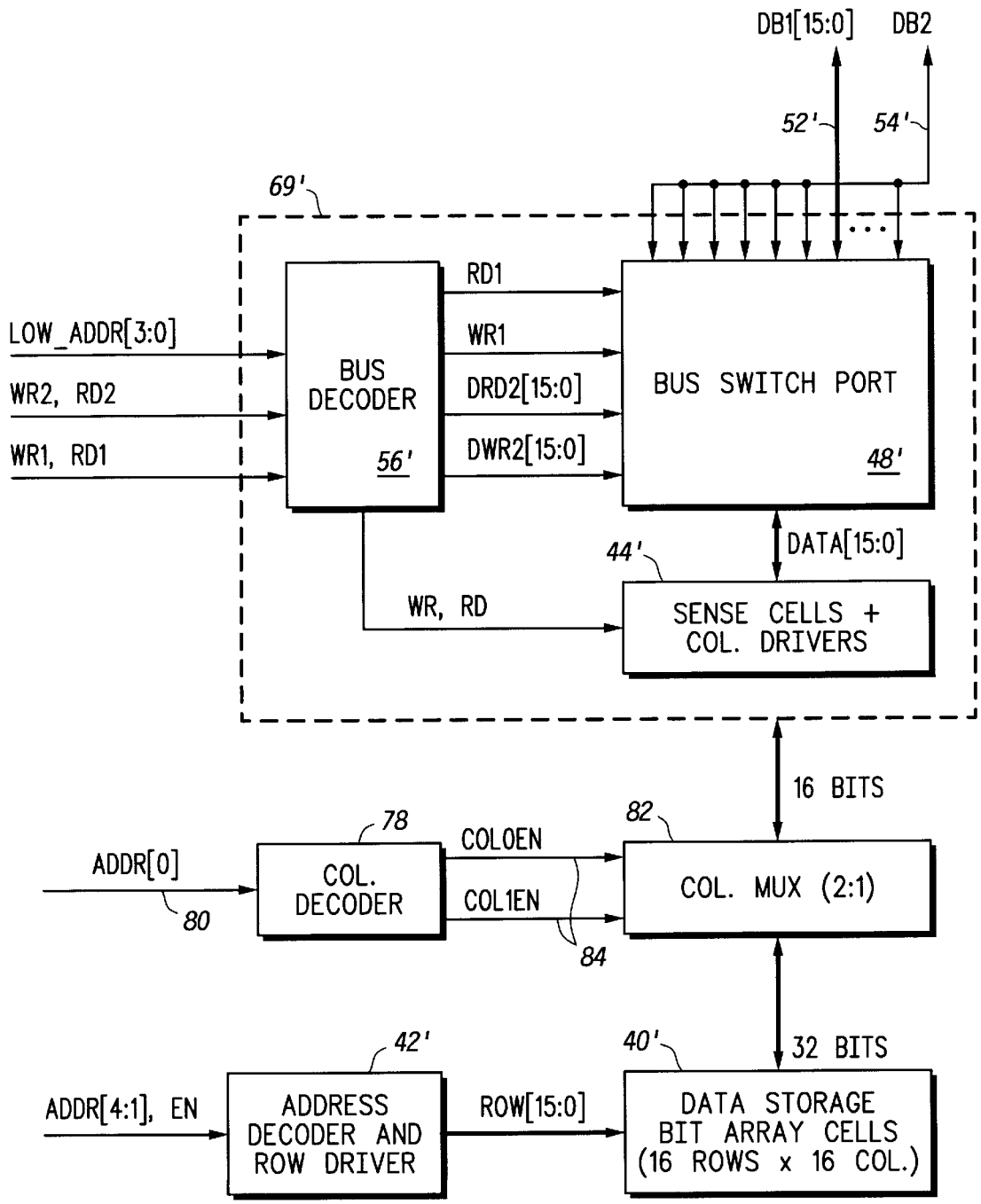
FIG. 4 is a simplified schematic diagram of a DRAM with column muxing according to the present invention.

In FIG. 4 the DRAM is similar to that of FIG. 3 and like parts have the same but primed reference numbers (this applies also with further drawings). One change in the DRAM of FIG. 4 is that it is extended with column muxing. Now, data storage 40' is organized in sixteen rows but thirty-two columns of bit array cells, thus storing words of a storage word width of thirty-two. The address space of data storage 40' is increased by a factor of two as is the data storage 40' itself by the doubled word width. Therefore, another address bit addr[0] is now provided to a total of five word address bits, four of which addr[4:1] are fed to row address decoder and driver 42' as before and address bit addr[0] is fed to column decoder 78 via address line 80. This applies in both one-bit and sixteen-bit modes. Column decoder 78 controls column multiplexer 82 between data storage 40' and sense cells and column drivers 44' according to the value of address bit addr[0] via column enable signals col0en, col1en on multiplexer lines 84.

Another change in the DRAM of FIG. 4 is that no select mode signal is provided to bus decoder 56'. Instead, this sm signal is evaluated from the write/read signal pairs wr1, rd1 and wr2, rd2 so that first data bus 52' always operates, for example, in sixteen-bit mode and second data bus 54' always operates, for example, in one-bit mode. Outside the RAM care will be taken so that only one data bus operates at a time. Then, it is possible to allocate a part of data storage 40' for sixteen-bit mode operation and another part for one-bit mode operation.

Bus decoder 56', bus switch port 48', sense cells and column drivers 44' and the connections between these form means for selectively transferring data 69' between data storage 40' and first data bus 52' with a first bus word width p=16 and second data bus 54' with a second bus word width q=1 smaller than the first bus word width p=16. Means for selectively transferring data 69' comprises a bus select and adaption decoder, namely bus decoder 56', for providing electrical signals for selecting a data bus and selecting columns of bit array cells according to the width of the selected data bus. These control signals are passed to bus switch port 48'.

Figure 5:
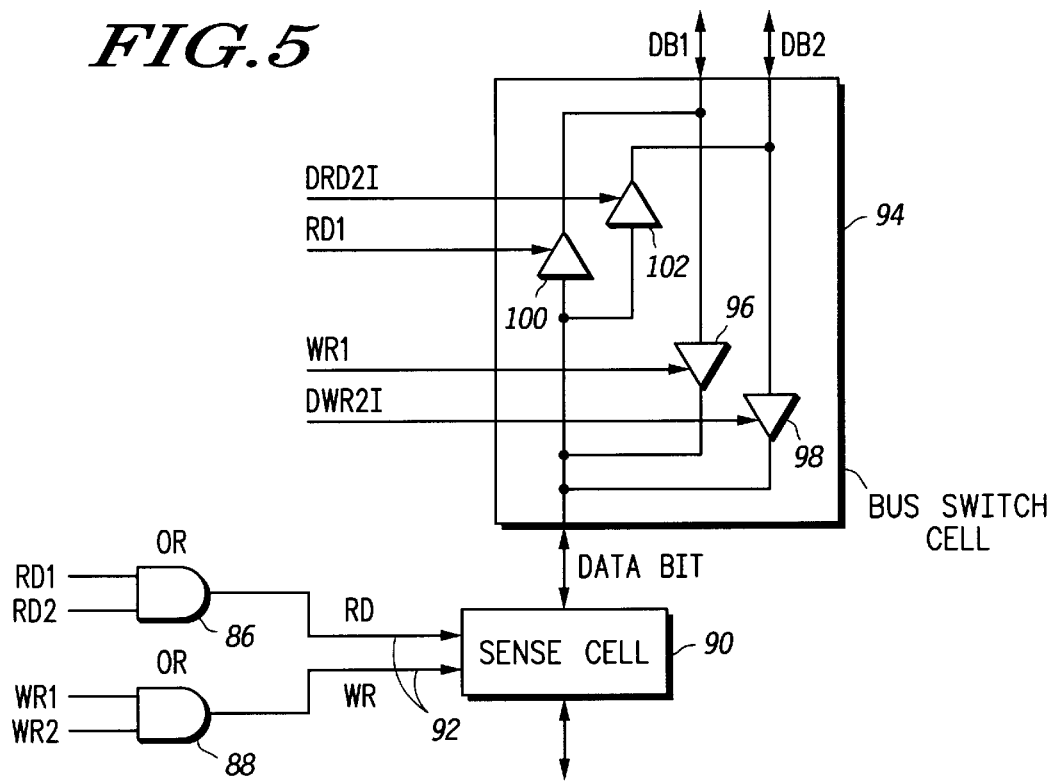
FIG. 5 is a schematic diagram of a part of a DRAM according to the present invention.

FIG. 5 discloses a part of bus decoder, bus switch port, and sense cells and column drivers according to the present invention, namely a one bit part of the parallel data flow in vertical direction. In the lower left area of FIG. 5 are OR gates 86, 88 that can be part of the bus decoder 56' of FIG. 4. These OR gates generate decoded write/read signals wr, rd that are bus independent and are submitted from the bus decoder to all conventional parallel sense cells 90 via signal lines 92. This shows how write/read signals wr, rd are decoded from the input signals of the bus decoder.

Above sense cell 90 is shown bus switch cell 94 that is a part of the bus switch port and serves as port cell connecting sense cell 90 to first data bus db1 and second data bus db2. Transfer gates 96, 98 perform write operations to the memory, i.e. to sense cell 90 from first data bus db1 and second data bus db2, respectively. Transfer gates 100, 102 perform read operations from the memory, i.e. from sense cell 90 to first data bus db1 and second data bus db2, respectively. With respect to FIG. 4, note that transfer gates 96, 100 perform operations on first data bus db1 controlled by write/read signals wr1, rd1 that apply to all parallel sense cells simultaneously. Transfer gates 98, 102 perform operations on second data bus db2 controlled by decoded write/read signals dwr2i/drd2i that specifically apply to sense cell i shown in FIG. 5.

Figure 6:
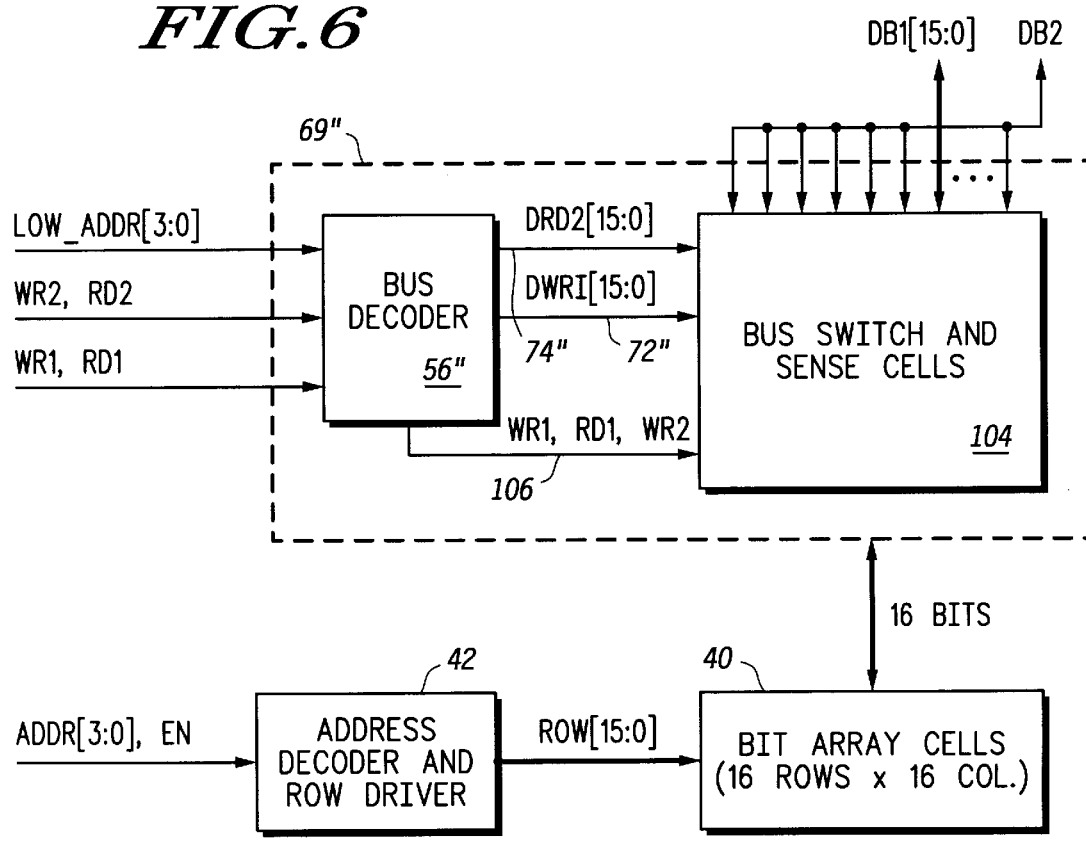
FIG. 6 is a simplified schematic diagram of another embodiment of the present invention.

FIG. 6 shows a DRAM similar to that of FIG. 3, FIG. 4 but where bus switch port and sense cells and column drivers are combined in bus switch and sense cells 104. This reduces the control wiring. Between bus decoder 56" and bus switch and sense cells 104 only sixteen bit wide write control lines 72"/read control lines 74" are provided for decoded write/read signals dwr2/drd2 and control lines 106 for signals wr1, rd1 and wri. No redundant lines to separate sense cells are necessary.

Bus decoder 56", bus switch and sense cells 104 and the connections between these form means for selectively transferring data 69" between data storage 40 and first data bus db2 with a first bus word width p=16 and second data bus db2 with a second bus word width q=1 smaller than the first bus word width p=16. Means for selectively transferring data 69" comprises a bus select and adaption decoder, namely bus decoder 56", for providing electrical signals for selecting a data bus and selecting columns of bit array cells according to the width of the selected data bus. These control signals are passed to bus switch and sense cells 104.

Figure 7:
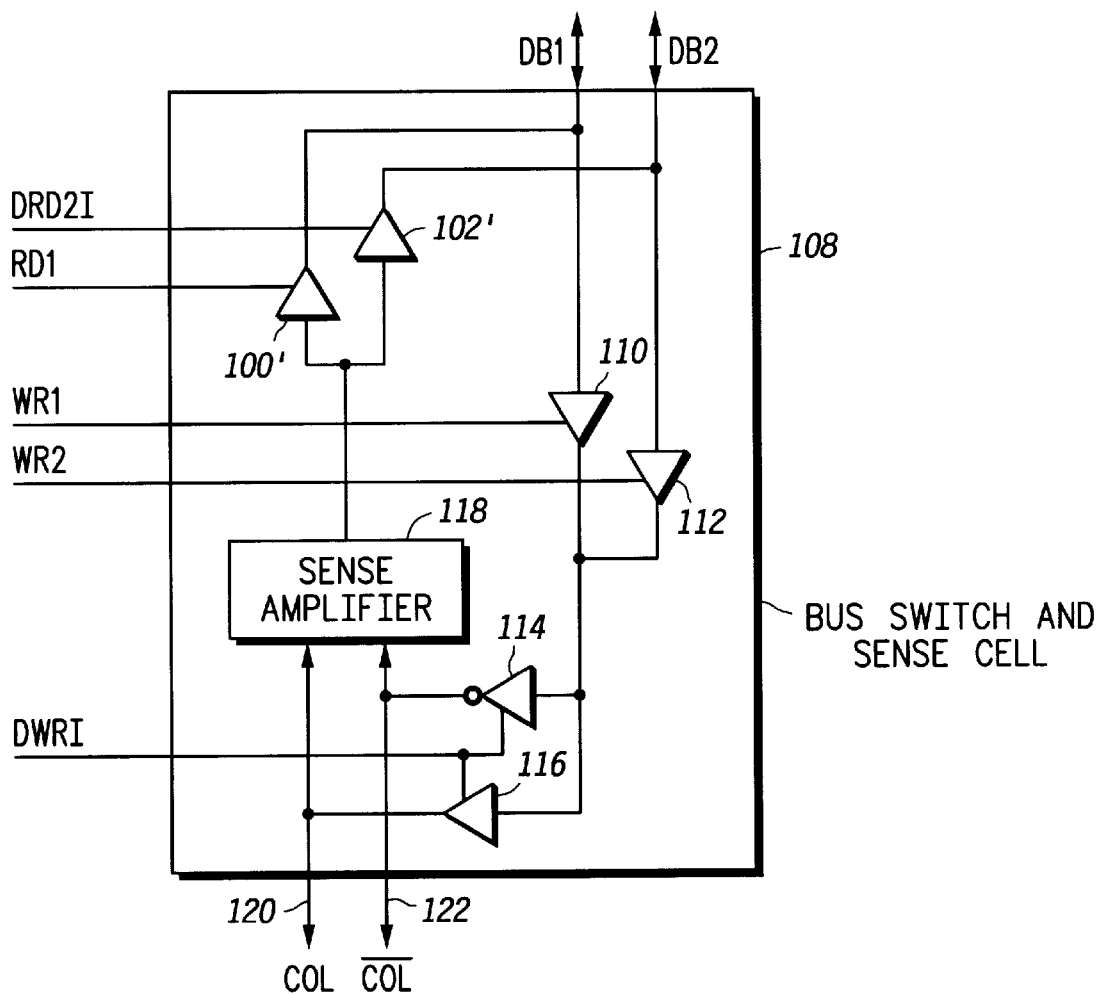
FIG. 7 is a schematic diagram of another part of a DRAM according to the present invention.

FIG. 7, similar to FIG. 5 discloses one bus switch and sense cell 108 of parallel bus switch and sense cells that are useful in bus switch and sense cells 104 of FIG. 6. This cell provides a one bit part of the parallel data flow in vertical direction. Transfer gates 110, 112, 114, 116 perform write operations to the memory, i.e. to sense amplifier 118 from first data bus db1 and second data bus db2. Sense amplifier 118 is of a dual line type where additionally to the data line col 120 a second inverse data line 122 is provided. Transfer gates 100', 102' perform read operations from the memory, i.e. from sense amplifier 118 to first data bus db1 and second data bus db2, respectively. With respect to FIG. 5, note that transfer gates 100', 110 perform operations on first data bus db1 controlled by write/read signals wr1, rd1. Transfer gates 102', 112 perform operations on second data bus db2 controlled by write signals wr2 that apply to all parallel sense cells simultaneously and decoded read signals drd2i that specifically apply to sense cell i shown in FIG. 7. Decoded signal dwri that specifically applies to sense cell i causes transfer gates 114, 116 to transfer the data bit on the actual active data bus to data line pair 120, 122.

This example shows that sense amplifiers of a dual line type also allow simple combined bus switch and sense cells. In this type, in addition to the usual one data line for each bit, there is provided a second data line with the same information but of inverse polarity.

Figure 8:
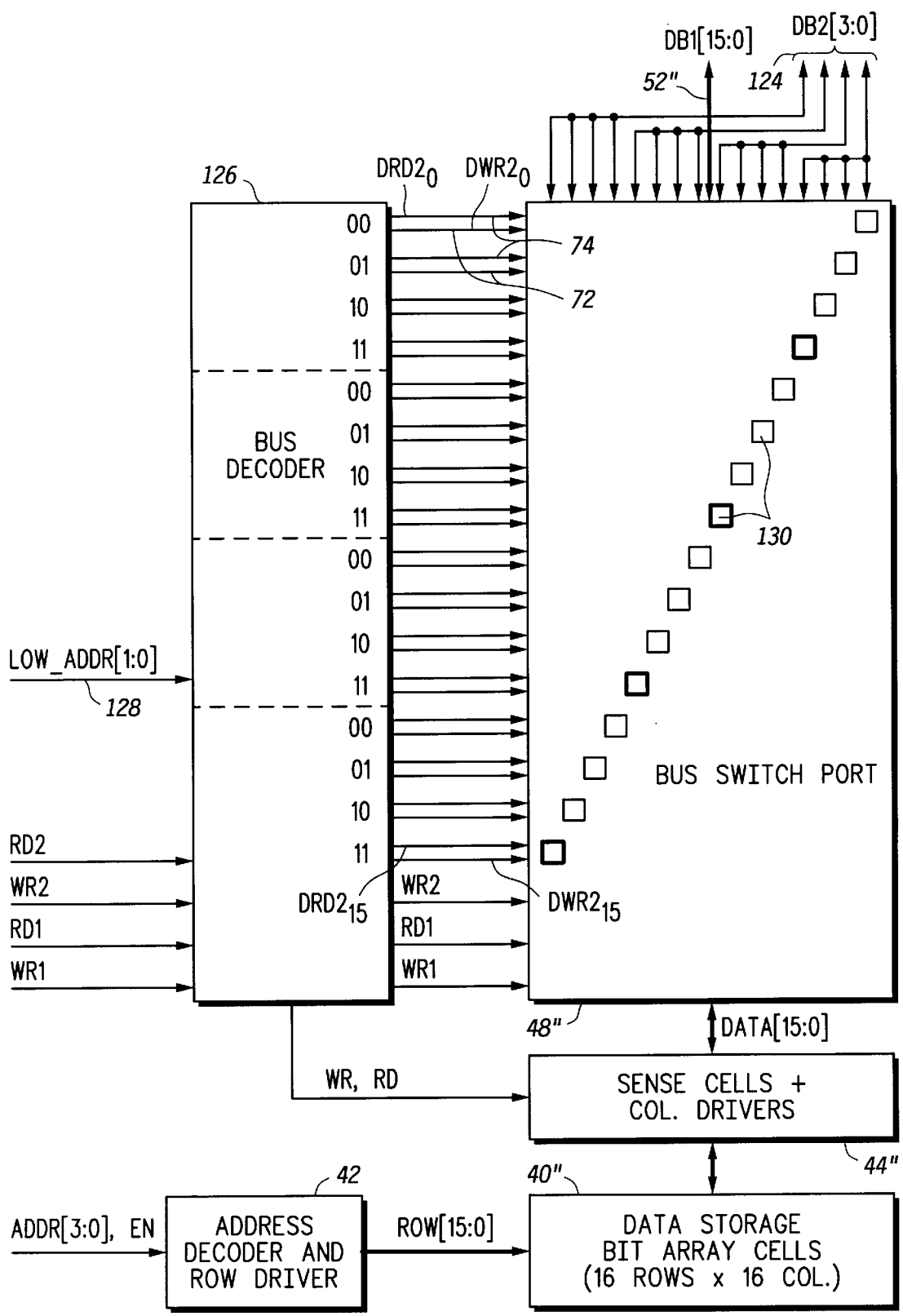
FIG. 8 is a schematic diagram of still another embodiment of the present invention.

FIG. 8 demonstrates another DRAM similar to that of FIG. 3, FIG. 4 with separate sense cells and column drivers 44''' and bus switch port 48'''. Here, the main difference is that second data bus db2 124 is four bits wide: db2[3:0] where first data bus 52''' is again sixteen bits wide. Accordingly, bus decoder 126 decodes now two-bit within-a-word address signals low_addr[1:0] on input address lines 128. Thus, four words of width four are stored within one sixteen-bit basic word of data storage 40''' with respect to the within-a-word address. The cell concept is demonstrated by sixteen bus switch cells 130 of bus switch port 48''', the internal connections not shown for simplicity. From the outside, each bus switch cell 130 is data connected to one of the four bit lines of second data bus 124, each of the four bit lines to four bus switch cells 130. Each bus switch cell 130 is control connected to bus decoder 126 by one pair of write/read lines that submit decoded write signal dwr2/read signal drd2 on signal lines 72'''/74''' for accessing second data bus 124. Sixteen pairs of signals dwr2/drd2 on write/read lines to sixteen bus switch cells 130 are indexed [15:0]. Each bus switch cell 130 corresponds to one bit of the sixteen bit basic word and also to one bit of four words of four bits each of second data bus db2 124. Within a sixteen bit basic word the four-bit words have within-a-word addresses two bits wide ranging from [00] to [11]. The four bits of one word are processed in parallel, but according to this example not by adjacent bus switch cells 130. Bus switch cells 130 that relate to within-a-word address [11] are marked with thick lines. Groups of four adjacent bus switch cells 130 relate to the same of four bit lines of second data bus 124. Thus, in this example, the outside "data wiring" is simple, bus switch port 48''' is of a universal type, and bus decoder 126 is adapted to the width of second data bus db2 124 and to the outside wiring.

Those of skill in the art will understand that the bit lines of the second data bus within the bus switch port can be split with the advantage of a simpler outside "data wiring" at the expense of a less universal bus switch port. Also, a different grouping with four adjacent bus switch cells relating to one data word of the second data bus can simplify the bus decoder.

Figure 9:
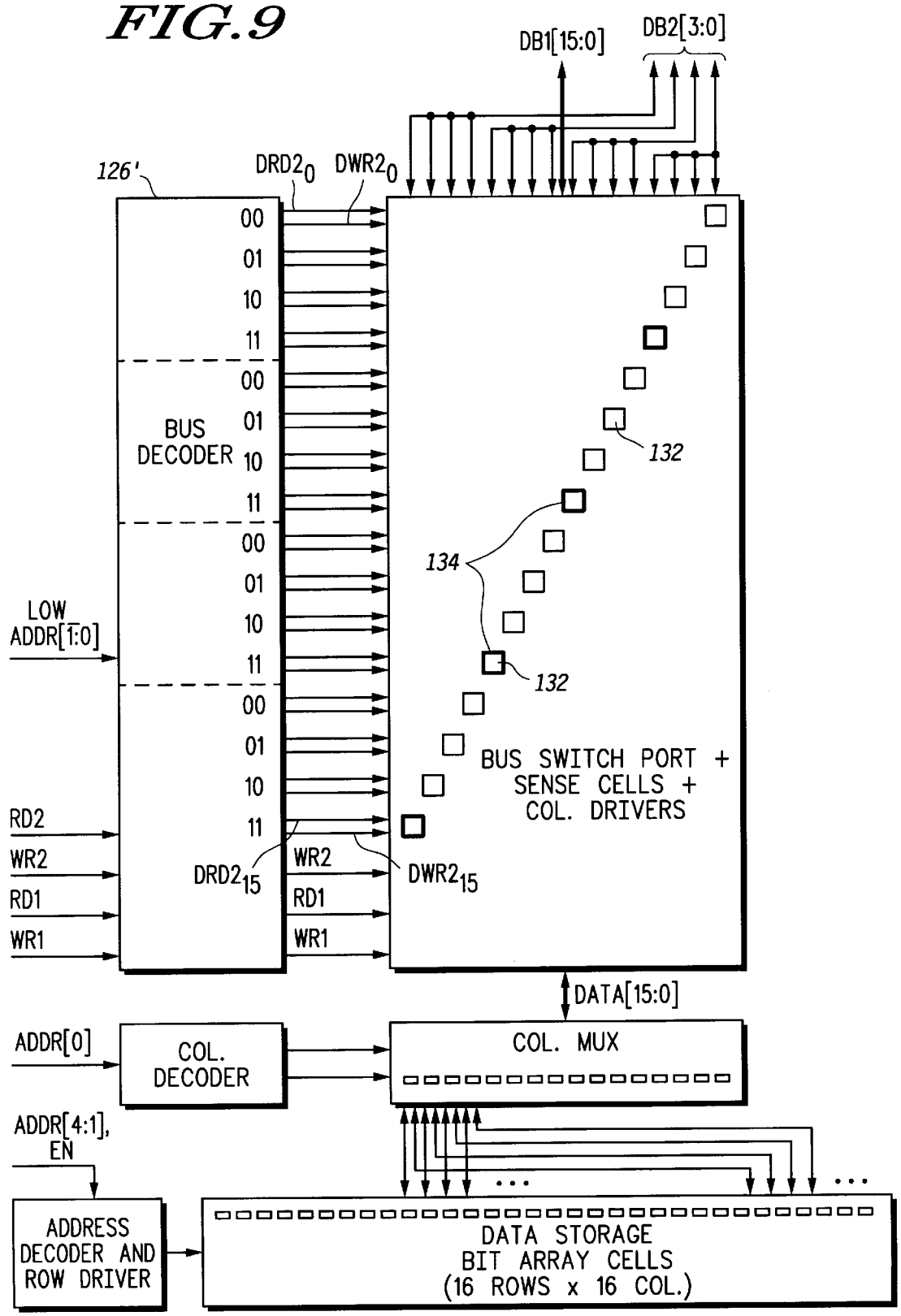
FIG. 9 is a schematic diagram of yet another embodiment of the present invention.

FIG. 9 shows a DRAM similar to that of FIG. 6 but where bus switch port and sense cells and column drivers are combined in bus switch and sense cells 132 of the type shown in FIG. 7. This allows column multiplexing and reduces the control wiring somewhat in that redundant lines from bus decoder 126' to bus switch port 48''' and to sense cells 44''' of FIG. 8 are omitted. Between Multiplexer and data storage only few data lines are shown in order to simplify the drawing.

In both modes, bus decoder 126' performs the logical operations (FIG. 9, FIG. 7):

$dwr_i$=(wr2 AND (low_addr==mod$_x$i)) OR wr1

$drd2_i$=rd2 AND (low_addr==mod$_x$i), with i is the index of sense cell, x is derived from bus decoder decoding level, x=4 for four data words of bus db2 within one basic word, and $mod_x$ is the modulo function on base x. If bus db2 is accessed, bus switch cells 134 that relate to within-a-word address $low_{13}addr=[11]$ are marked with thick lines. That is, the four bits of the second data bus db2 data word that is stored at the within-a-word address low__addr=[11] of a basic word is actually stored at the bits i=3, 7, 11, 15. For these bits, low__addr==$mod_x$ i and signals $dwr_i$ and $drd2_i$ become logically one if one of signals wr2, rd2 is logically one.

Those of skill in the art understand that different buses do not need different hardware buses and include different virtual buses on the same hardware bus. That is, in different virtual buses a different group of physical bit lines is used to transmit a data word. Then, a memory for storing addressable binary data comprises a data storage organized in rows and columns of bit array cells, row address decoder and driver means for addressing a selected row of bit array cells, column drivers means for driving selected columns of bit array cells, and an adaption decoder. The adaption decoder provides electrical signals for selectively connecting selected columns of array cells with selected bits of a data bus according to a selection address submitted to the adaption decoder.

In the hardware, the adaption decoder is preferably physically located between a bus connection containing bus terminals, and a control unit that contains control elements responding to read and write signals. Then, it is not necessary to provide a large number of control lines from a separated decoder to a large number of bus switch cells, which means a large number of control lines perpendicular to the data bit lines. Instead, a small number of address lines perpendicular to the data bit lines are sufficient and the control signals for the bus switch cells are generated physically close to the bus switch cells. Preferably the adaption decoder and the memory are physically located on the same chip.

Now, storing and retrieving data of different word widths is described with respect to different buses of different bus word widths in a RAM having storage words of a storage word width as in the examples of FIG. 1 to FIG. 9. As the data is to be stored arrives on a data bus, this data bus is selected to connect to the data storage. This may happen with a write signal wr1 or wr2 or also with select mode signal sm. The actual word width is defined accordingly to the actual selected bus word width. The actual data word address of each actual data word in the storage has a high address portion containing the usual data storage word address, and a low address portion containing the position of each actual data word within the data storage word. In the case of selecting sixteen-bit data bus db1 and storing sixteen-bit data words in the data storage the low address portion is of width zero and no special address signal is needed. Then, the actual data word address is the usual data storage word address as in the prior art. If data bus db2 is selected, the low address portion is delivered with the low address signal low__addr. Now, that the destination of the actual data word is defined, it will be written from the selected data bus to the address.

When the data is to be retrieved from the data storage, a data bus is selected to connect to the data storage. This may happen with a read signal rd1 or rd2 or also with select mode signal sm. The actual word width is defined accordingly to the actual selected bus word width. The actual data word address of each actual data word in the storage has a high address portion containing the usual data storage word address, and a low address portion containing the position of each actual data word within the data storage word. In the case of selecting sixteen-bit data bus db1 and retrieving sixteen-bit data words from the data storage the low address portion is of width zero and no special address signal is needed. Then, the actual data word address is the usual data storage word address as in the prior art. If data bus db2 is selected, the low address portion is delivered with the low address signal low__addr. Now, that the location of the actual data word is defined, and it will be read from the actual data word address to the selected data bus.

Those of skill in the art understand that this invention has many applications, including but not limited to applications where more than two data buses connected to the data storage. Furthermore, the buses can be used with actual data word widths smaller than their hardware bit line widths, i.e. only a part of the bus is used for transferring data of actual data word width. Also, the invention is not limited to but applies to static RAM or other kinds of memory.

In the foregoing detailed description of the preferred embodiment, reference is made to the accompanying drawings which form a part hereof, and in which are shown by way of illustration specific embodiments in which the invention may be practiced. These embodiments have been described in sufficient detail to enable those skilled in the art to practice the invention, and it is to be understood that other embodiments may be utilized and that logical, mechanical and electrical changes may be made without departing from the spirit and scope of the present invention. The foregoing detailed description is, therefore, not to be taken in a limiting sense, and the scope of the present inventions is defined only by the appended claims.

What is claimed is:

1. A memory for storing addressable binary data comprising:

a data storage organized in rows and columns of bit array cells, row address decoder and driver means for addressing a selected row of bit array cells, column drivers means for driving selected columns of bit array cells, a first data bus port adapted to be coupled to a first data bus with a first bus word width p, a second data bus port adapted to be coupled to a second data bus with a second bus word width q smaller than the first bus word width p, and means for selectively transferring data between the data storage and a selected one of the first data bus and the second data bus, and a bus select and adaptation decoder for providing electrical signals for selecting a data bus and selecting columns of bit array cells according to the width of the selected data bus, and wherein the bus select and adaption decoder has control input signal lines for the signals:

read first data bus signal for reading from the data storage to the first data bus, write first data bus signal for writing to the data storage from the first data bus, read second data bus signal for reading from the data storage to the second data bus, write second data bus signal for writing to the data storage from the second data bus, size mode select signal for adapting the data storage to the selected data bus word width, and low address signal for selecting a group of q columns of bit array cells when the second data bus is selected.

2. The memory of claim 1 wherein the bus select and adaption decoder is adapted to generate the size mode select signal from the read first data bus signal, the write first data bus signal, the read second data bus signal, and the write second data bus signal.

3. The memory of claim 1 wherein the means for selectively transferring data has bus switch cells, each bus switch cell selectively connecting one bit array cell with one bit line of the first data bus or the second data bus.

4. The memory of claim 3 wherein the bus select and adaption decoder has output control signal lines for the signals:

read first data bus signal, write first data bus signal, read bit line signals for reading from the data storage to the second data bus for each bus switch cell, write bit line signal for writing to the data storage from the second data bus for each bus switch cell.

* * * * *